(12) United States Patent
Itoh et al.

(10) Patent No.: US 6,897,433 B2
(45) Date of Patent: May 24, 2005

(54) METHOD FOR REWRITING DATA IN THREE-DIMENSIONAL OPTICAL MEMORY DEVICE FABRICATED IN GLASS BY ULTRA-SHORT LIGHT PULSE

(75) Inventors: Kazuyoshi Itoh, Hyogo (JP); Wataru Watanabe, Kyoto (JP); Tadamasa Toma, Osaka (JP)

(73) Assignee: Japan Science and Technology Corporation, Kawaguchi (JP)

( * ) Notice: Subject to any disclaimer, the term of this patent is extended or adjusted under 35 U.S.C. 154(b) by 153 days.

(21) Appl. No.: 10/276,695

(22) PCT Filed: May 18, 2001

(86) PCT No.: PCT/JP01/04143
§ 371 (c)(1),
(2), (4) Date: Apr. 17, 2003

(87) PCT Pub. No.: WO01/88925
PCT Pub. Date: Nov. 22, 2001

(65) Prior Publication Data
US 2003/0174552 A1 Sep. 18, 2003

(30) Foreign Application Priority Data
May 18, 2000 (JP) ...................................... 2000-145922

(51) Int. Cl.[7] ................................................. H01J 3/14
(52) U.S. Cl. ..................................................... 250/216
(58) Field of Search .............................. 250/216, 201.5;
369/47.32, 47.33, 47.34, 103; 359/620

(56) References Cited
U.S. PATENT DOCUMENTS 5,264,876 A * 11/1993 Kawade et al. ............. 347/262
5,694,249 A * 12/1997 Misawa ....................... 359/620
5,698,344 A * 12/1997 Bai et al. ......................... 430/1

FOREIGN PATENT DOCUMENTS

| JP | 49-106251 | 10/1974 |
|---|---|---|
| JP | 10-261225 | 9/1998 |
| JP | 11-232706 | 8/1999 |

OTHER PUBLICATIONS

E.N. Glezer et al.: "3-D optical storage inside transparent materials" Optics Letters, vol. 21, No. 24, pp. 2023-2025 1996.

Hong-Bo Sun et al.: "Microfabrication and characteristics of two-dimensional photonic crystal structures in vitreous silica" Optical Review, vol. 6, No. 5, pp. 396-398 1999.

* cited by examiner

Primary Examiner—Don Wong
Assistant Examiner—Hung Tran Vy
(74) Attorney, Agent, or Firm—Oblon, Spivak, McClelland, Maier & Neustadt, P.C.

(57) ABSTRACT

A method for rewriting data in a three-dimensional optical memory element created in glass with ultrashort light pulse includes creating a bit due to a photo-induced contrast in index of refraction inside the glass in three dimensions depending of the strength of a first ultrashort-pulse laser beam. Then, irradiating the bit created in three dimensions with a second ultrashort-pulse laser beam having a lower energy than the strength of the first ultrashort-pulse laser beam while condensing the second ultrashort-pulse laser beam with an optical lens at a point shifted from the bit to be moved by a predetermined distance in an opposite direction from the direction of propagation of the first and second ultrashort pulse laser beams, thereby moving the bit for rewriting.

5 Claims, 6 Drawing Sheets

(c)

(b)

(a)

5μm

METHOD FOR REWRITING DATA IN THREE-DIMENSIONAL OPTICAL MEMORY DEVICE FABRICATED IN GLASS BY ULTRA-SHORT LIGHT PULSE

TECHNICAL FIELD

The present invention relates to a method for rewriting data in a three-dimensional optical memory element created in glass using ultrashort light pulses.

BACKGROUND ART

Recently, large-capacity, high-density, and high-speed memory systems capable of freely processing video information are essential for the future information field. Studies are conducted which create a three-dimensional optical memory inside quartz glass on the basis of the advance of light waveguides and ultrashort-pulse laser beam processing technologies. A laser beam is emitted and condensed inside glass to create spots that have a photo-induced contrast in index of refraction at a focal light point. They are deposited and aligned as bits in three dimensions, and are read out with light using the contrast in index of refractive, in which a capacity two digits larger than before can be expected, but rewriting is not yet possible.

As described above, recently, a demand for a large capacity of information transmission is increasing and research and development of higher-density optical memory elements are popular. As a method for achieving higher density of recording media, attempts are being made to make a recording region from a two-dimensional one to a three-dimensional one. There is provided a photochromic memory that uses photochromatism of a photochromic molecule. Although it is a rewritable memory because of its reversible reaction, there is a problem in thermal stability and repetitive durability because of the chromatic reaction of an organic material.

On the other hand, a light-guide manufacturing technique and a laser-beam processing technique have made a remarkable advance, recent papers report creation of a three-dimensional optical memory inside a stable glass material. When a transparent material such as glass is irradiated with condensed ultrashort light pulses, the vicinity of the focal light point has photo-induced contrast in index of refraction, having a different index of refraction from the surroundings to create bits. Such bits are arranged in a three-dimensional array.

Such conventional arts include the following:

(1) Japanese Unexamined Patent Application Publication No. 8-220688

(2) E. N. Glezer et al., Optics Letters, vol. 21, No. 24, p 2023–2025 (1996)

(3) Hiroaki Misawa, Kagaku to Kogyo (Chemistry and Industry), vol.9, No. 2, p 178–180 (1996)

(4) Hiroaki Misawa, O plus E, vol. 20, No. 9, p 1028–1032 (1998)

(5) Hong-Bo Sun et al., Optical Review, vol. 6, No. 5 (1999)

DISCLOSURE OF INVENTION

However, the conventional arts disclosed above are all for recording and reproducing, which cannot delete or transfer the generated bits, thus being unable to perform rewriting.

On the other hand, in view of glass fabrication, a reforming technique for a transparent dielectric bulk using ultrashort light pulses is applied to the field of a light guide and three-dimensional fabrication. In such glass micro/high-precision fabrication fields, formation and correction of the contrast in index of refraction are required.

The object of the present invention is to provide a method for rewriting data in a three-dimensional optical memory element created in glass with ultrashort light pulses in which the above-described conventional-art's problems are solved to allow the created bits to be moved for rewriting.

In order to achieve the above object, the present invention is characterized in that:

[1] A method for rewriting data in a three-dimensional optical memory element created in glass with ultrashort light pulses is characterized by comprising the steps of: creating bits due to photo-induced contrast in index of refraction inside the glass in three dimensions by the strength of a first ultrashort-pulse laser beam; and irradiating the bits created in three dimensions with a second ultrashort-pulse laser beam having a lower energy than the strength of the first ultrashort-pulse laser beam, and when condensing the laser beam with an optical lens, condensing the laser beam at a point shifted from the bits to be moved by a predetermined distance in the opposite direction from the direction of propagation of the laser beam, thereby moving the bits for rewriting.

[2] The method for rewriting data in a three-dimensional optical memory element created in glass with ultrashort light pulses according to [1] is characterized in that the creation of the bits is performed by differentiating the index of refraction in submicron-sized voids created by convergent irradiation of ultrashort laser-beam pulses of 1 ps or less from that in the vicinity of the bits.

[3] The method for rewriting data in a three-dimensional optical memory element created in glass with ultrashort light pulses according to [1] is characterized in that the transfer of the light-condensing point is performed a plurality of times so that the point is moved in stages.

[4] The method for rewriting data in a three-dimensional optical memory element created in glass with ultrashort light pulses according to [1] is characterized in that the glass is silica glass or silicate glass.

[5] The method for rewriting data in a three-dimensional optical memory element created in glass with ultrashort light pulses according to [1] is characterized in that the ultrashort-pulse laser beam is of 800 nm.

BEST MODE FOR CARRYING OUT THE INVENTION

Embodiments of the present invention will be specifically described.

Figure 1:
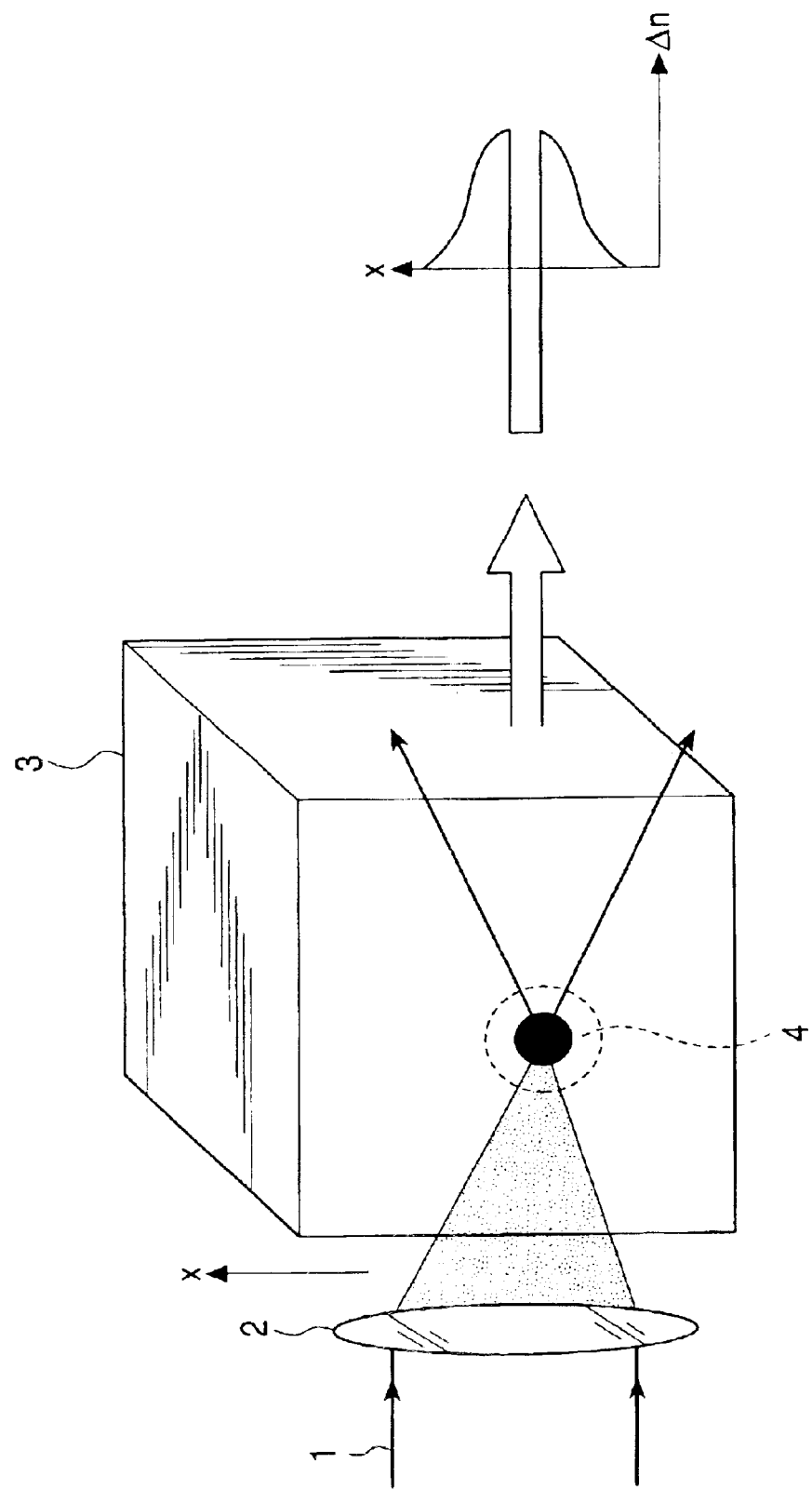
FIG. 1 is a schematic diagram showing the principle of the present invention.

FIG. 1 is a schematic diagram showing the principle of the present invention.

In this drawing, reference numeral 1 denotes an ultrashort light pulse, reference numeral 2 denotes a condensing lens, reference numeral 3 denotes glass, and reference numeral 4 denotes a refractive-index altered region inside the glass. Such alternation in index of refraction occurs locally by multiphoton absorption and an alternation Δn in index of refraction is shown around the focal point.

In other words, the quality inside the glass is reformed by multiphoton absorption, the glass being melted by a rewriting laser beam and voids in the vicinity thereof are moved before new voids are created.

Figure 2:
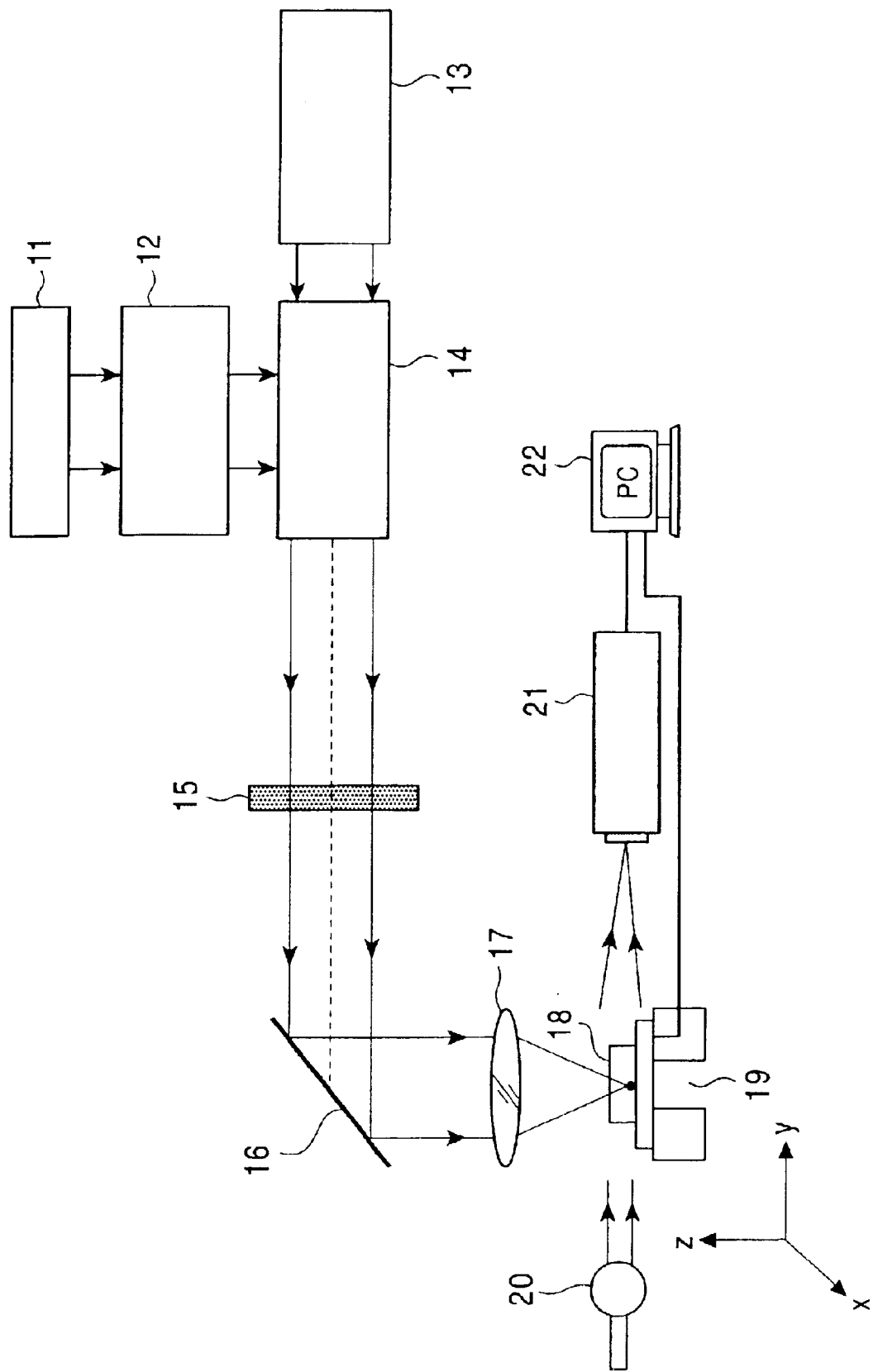
FIG. 2 is a block diagram of a rewriting system for a three-dimensional optical memory element created in glass with ultrashort light pulses, showing an embodiment of the present invention.

FIG. 2 is a block diagram of a rewriting system for a three-dimensional optical memory element created in glass with ultrashort light pulses, showing an embodiment of the present invention.

In the drawing, reference numeral 11 denotes an Ar+ laser, numeral 12 denotes a mode locked Ti:sapphire laser, numeral 13 denotes an Nd:YLF laser, numeral 14 denotes a regenerative amplifier, numeral 15 denotes an ND filter, numeral 16 denotes a mirror, numeral 17 denotes a condensing lens, numeral 18 denotes glass, numeral 19 denotes an XYZ stage, numeral 20 denotes a halogen lamp, numeral 21 denotes a CCD camera, and numeral 22 denotes a computer.

As shown in the drawing, the Ti:sapphire laser is emitted onto the glass 18 set on the XYZ stage 19 through the condensing lens 17 to create bits (spots, voids, cavities). The stored bits can be rewritten as will be described later.

The state of the bits can be imaged by light emitted from the halogen lamp 20 with the CCD camera 21.

As stated above, for the light source, the Ti:sapphire laser (wavelength: 800 nm, power: 1 mW, pulse width: 130 fs, repetition frequency: 1 kHz) is used, with an exposure time of $\frac{1}{125}$s, using an electromagnetic shutter. The numerical aperture (NA) of the lens is 0.55, eight shots are taken, the strength during writing is 0.95 μJ, the strength during transfer is 0.74 μJ. The bits are created at a depth of 300 μm from the surface.

Figure 3:
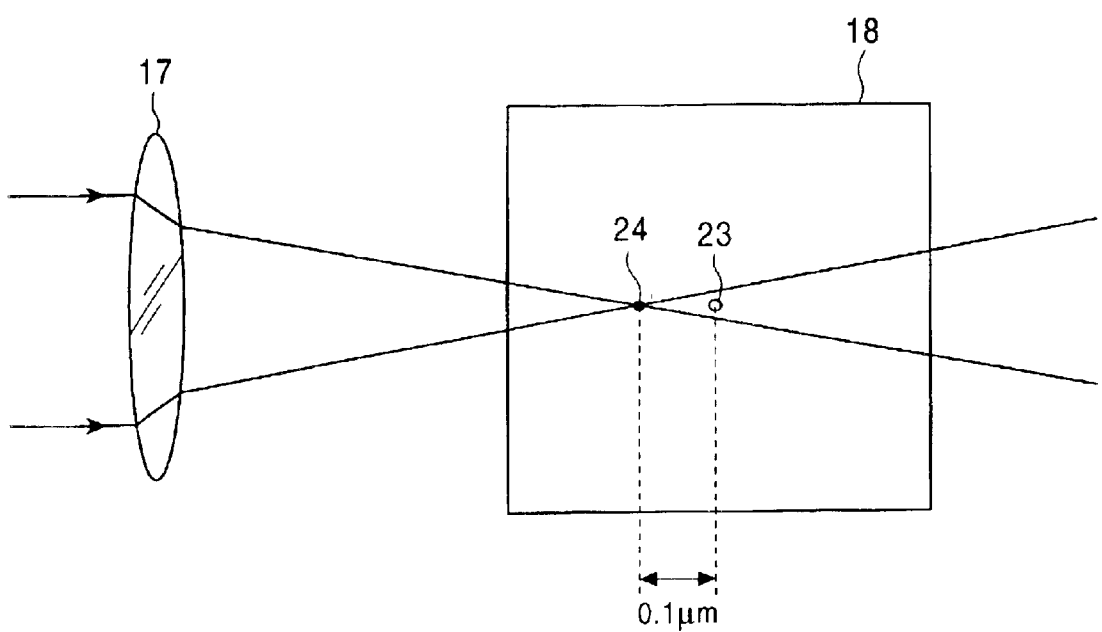
FIG. 3 is an explanatory diagram of a transferring process for created bits.

In this embodiment, the laser was emitted so as to be 0.1 μm shifted from a previously created bit 23, as shown in FIG. 3.

As a result of repeated experiments, a shift of 0.5 μm could be provided by one shot.

The glass was a silica glass, in which the bit 23 could be shifted only when irradiated with the laser beam, with a focal light point 24 shifted in the opposite direction from the traveling direction of the laser beam, toward this side seen from the laser, being unable to be moved by a backward shift.

Figure 4:
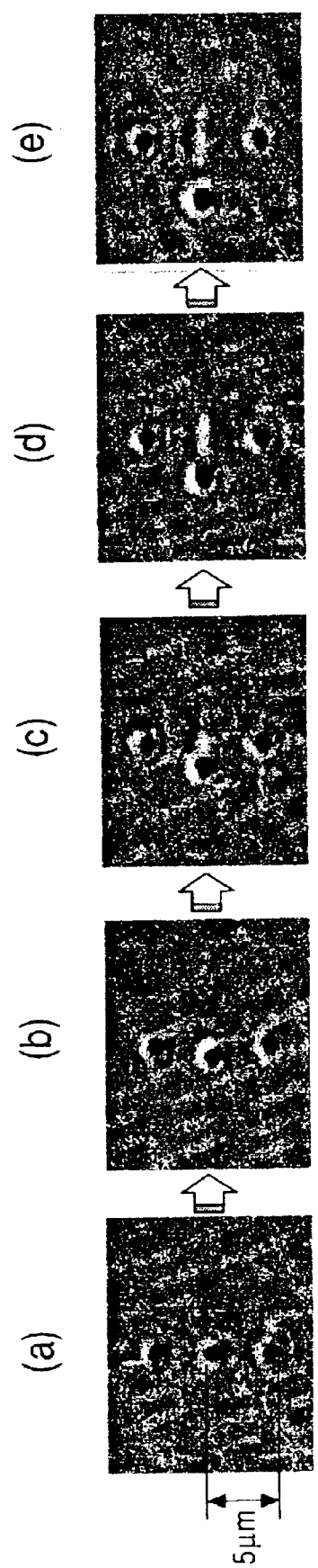
FIG. 4 is a diagram showing a first transferring process for voids (bits) according to the present invention.

FIG. 4 is a diagram showing a first transferring process for voids (bits) according to the present invention. After voids have been created once (refer to FIG. 4(a)), light is emitted such that a focal light point is shifted by 0.1 μm in the opposite direction to the direction of propagation of pulses (refer to FIGS. 4(b) to 4(c)). In other words, the bits are rewritten under the condition shown in FIG. 3.

Figure 5:
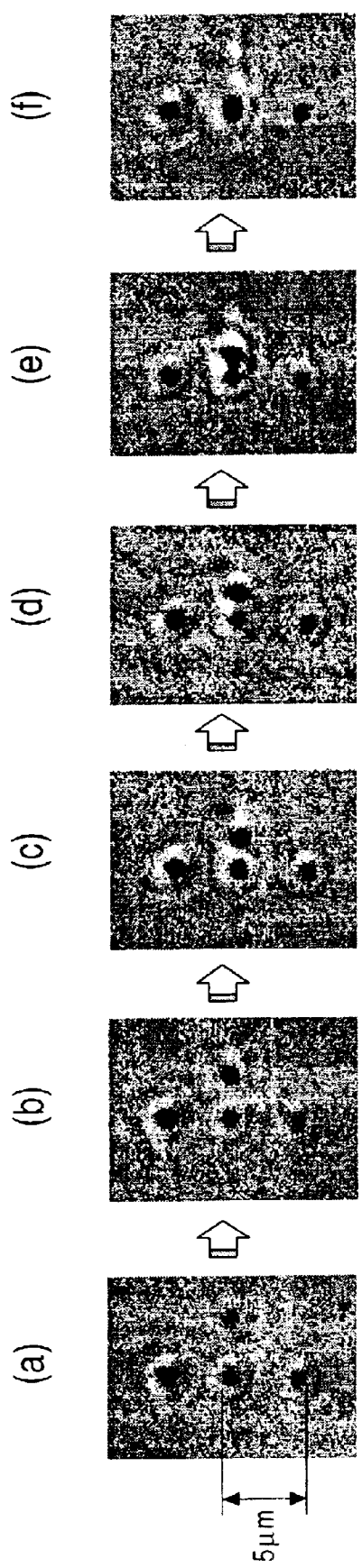
FIG. 5 is a diagram showing a second transferring process for voids (bits) according to the present invention.

FIG. 5 is a diagram showing a second transferring process for voids (bits) according to the present invention. After voids have been created so that two voids are arranged in line (refer to FIG. 5(a)), a focal light point is shifted by 0.1 μm in the opposite direction to the direction of propagation of pulses to move the right void of the two to the left, thereby joining it with the other void (refer to FIGS. 5(b) to 5(f)). The bits are rewritten under the condition shown in FIG. 2. The joined void becomes larger than the original ones.

Figure 6:
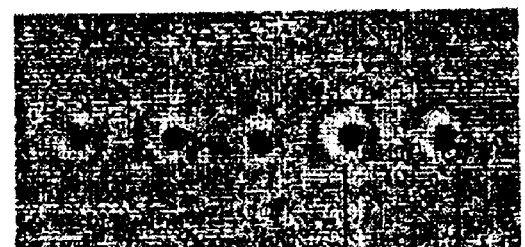
FIG. 6 is a diagram showing a third transferring process for voids (bits) according to the present invention.
Figure 6:
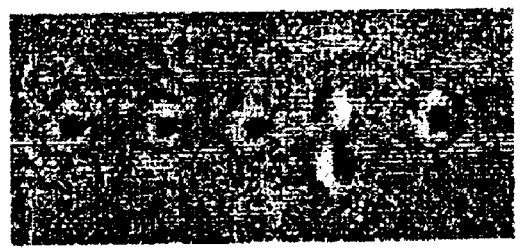
Figure 6:

FIG. 6 is a diagram showing a third transferring process for voids (bits) according to the present invention. After voids have been created once (refer to FIG. 6(a)), they are shifted one by one to produce a dynamic memory (refer to FIGS. 6(b) to 6(c)). The bits are rewritten under the condition shown in FIG. 3.

It is to be understood that the present invention is not limited to the above embodiments, and various modifications and variations are possible and should be considered to be within the scope of the invention.

As specifically described, the present invention has the following advantages:

A rewritable three-dimensional memory element can be created. Also, application to the formation and correction of the contrast in index of refraction can be expected in the field of glass microfabrication.

Higher-speed (20 to 50 Gbps) creation and rewriting of memory can be expected.

More specifically, by condensing and emitting a femtosecond laser beam into quarts, submicron-sized voids can be created at the focal light point. It was found that by condensing a femtosecond laser beam having a lower energy than that during manufacturing the voids slightly on this side of the submicron-sized voids seen from the laser, voids can be transferred. The submicron-sized voids are 5 μm shifted, so that the original voids or bits can be eliminated. The bits can also be combined.

Since a capacity 100 times that of the existing CDs can be provided, it is expected as a storage medium of the next generation. Also, it can be applied to the field of glass fabrication using a femtosecond laser, for example, to the field of correction of the contrast in index of refraction inside glass and glass microfabrication in manufacturing waveguides.

INDUSTRIAL APPLICABILITY

A method for rewriting data in a three-dimensional memory element created in glass with ultrashort light pulses, according to the present invention, is suitable for creating a rewritable three-dimensional memory element and for forming and correcting the contrast in index of refraction in the field of glass microfabrication. Also, it can be applied to the field of glass fabrication using a femtosecond laser, for example, to the field of correction of the contrast in index of refraction inside glass and glass microfabrication in manufacturing waveguides.

What is claimed is:

1. A method for rewriting data in a three-dimensional optical memory element created in glass with ultrashort light pulses, comprising the steps of:
   (a) creating bits due to a photo-induced contrast in index of refraction inside the glass in three dimensions by a strength of a first ultrashort-pulse laser beam; and
   (b) irradiating the bits created in three dimensions with a second ultrashort-pulse laser beam having a lower energy than the strength of said first ultrashort-pulse laser beam, and when condensing the second ultrashort-pulse laser beam with an optical lens, condensing the second ultrashort-pulse laser beam at a point shifted from the bits to be moved by a predetermined distance in an opposite direction from the direction of propagation of the first and second ultrashort-pulse laser beams, thereby transferring the bit for rewriting.

2. The method for rewriting data in a three-dimensional optical memory element created in glass with ultrashort light pulses according to claim 1, wherein said step of creating bits comprises differentiating the index of refraction in submicron-sized voids created by convergent irradiation of the first ultrashort laser-beam in the form of first ultrashort laser beam pulses of 1 ps or less from that in the vicinity of the bits.

3. The method for rewriting data in a three-dimensional optical memory element created in glass with ultrashort light pulses according to claim 1, wherein said step of irradiating and condensing the second ultrashort-pulse laser beam at a point shifted from the bits to be moved by said predetermined distance is performed a plurality of times so that the point is moved in stages.

4. The method for rewriting data in a three-dimensional optical memory element created in glass with ultrashort light pulses according to claim 1, wherein said glass is silica glass or silicate glass.

5. The method for rewriting data in a three-dimensional optical memory element created in glass with ultrashort light pulses according to claim 1, wherein said ultrashort-pulse laser beam has a wavelength of 800 nm.

* * * * *